US012738848B2

(12) United States Patent
Blyth et al.

(10) Patent No.: US 12,738,848 B2
(45) Date of Patent: Sep. 15, 2026

(54) CURRENT ESTIMATION IN A POWER CONVERTER

(71) Applicant: Cirrus Logic International Semiconductor Ltd., Edinburgh (GB)

(72) Inventors: Malcolm Blyth, Edinburgh (GB); John B. Bowlerwell, Edinburgh (GB); Alastair M. Boomer, Edinburgh (GB); Holger Haiplik, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 69 days.

(21) Appl. No.: 18/946,316

(22) Filed: Nov. 13, 2024

(65) Prior Publication Data

US 2025/0070671 A1 Feb. 27, 2025

Related U.S. Application Data

(63) Continuation of application No. 18/698,674, filed as application No. PCT/GB2022/053022 on Nov. 29, (Continued)

(30) Foreign Application Priority Data

Jan. 20, 2022 (GB) ..................................... 2200734

(51) Int. Cl.

| | |
|---|---|
| ***H02M 3/158*** | (2006.01) |
| ***G01R 27/26*** | (2006.01) |
| ***H02M 1/00*** | (2006.01) |

(52) U.S. Cl.

CPC ......... *H02M 3/158* (2013.01); *G01R 27/2611* (2013.01); *H02M 1/0009* (2021.05)

(58) Field of Classification Search

CPC .... H02M 3/15; H02M 1/0009; G01R 27/2611

See application file for complete search history.

(56) References Cited

U.S. PATENT DOCUMENTS

| | | | | |
|---|---|---|---|---|
| 7,710,084 | B1 | 5/2010 | Guo | |
| 11,387,732 | B2 * | 7/2022 | King | H02M 1/08 |

(Continued)

FOREIGN PATENT DOCUMENTS

| | | | |
|---|---|---|---|
| WO | 2022020064 | A1 | 1/2022 |

OTHER PUBLICATIONS

International Search Report and Written Opinion of the International Searching Authority, International Application No. PCT/GB2022/053022, mailed Feb. 20, 2023.

(Continued)

*Primary Examiner* — Rafael O De Leon Domenech

(74) *Attorney, Agent, or Firm* — Jackson Walker L.L.P.

(57) ABSTRACT

Current detection circuitry for generating an average inductor current signal indicative of an average inductor current during an operational cycle of power converter circuitry, the current detection circuitry comprising: circuitry for generating a peak inductor current signal indicative of a peak inductor current during the operational cycle; and circuitry for applying a ripple current estimate signal, indicative of an estimate of half of a ripple current in the power converter circuitry, to the peak inductor current signal to generate the average inductor current signal, wherein the ripple current is equal to a difference between the average inductor current and the peak inductor current.

20 Claims, 14 Drawing Sheets

Related U.S. Application Data

2022, now Pat. No. 12,199,514, which is a continuation of application No. 17/699,269, filed on Mar. 21, 2022, now Pat. No. 12,040,710.

(60) Provisional application No. 63/292,177, filed on Dec. 21, 2021.

(56) References Cited

U.S. PATENT DOCUMENTS

| | | | | |
|---|---|---|---|---|
| 11,392,151 | B2 * | 7/2022 | MacKay | G05F 1/46 |
| 11,463,008 | B2 * | 10/2022 | Mackay | H02M 3/158 |
| 11,469,661 | B2 * | 10/2022 | King | H02J 7/855 |
| 11,476,766 | B2 * | 10/2022 | Lawrence | H02M 1/0035 |
| 11,515,707 | B2 * | 11/2022 | Mackay | H02J 3/32 |
| 11,522,440 | B2 * | 12/2022 | Sharma | H02J 7/855 |
| 11,522,460 | B2 * | 12/2022 | Lawrence | H02M 1/0025 |
| 12,040,710 | B2 | 7/2024 | Bowlerwell et al. | |
| 2005/0206358 | A1 | 9/2005 | Van Der Horn et al. | |
| 2017/0040895 | A1 | 2/2017 | May | |
| 2018/0063910 | A1 | 3/2018 | Schoenberger et al. | |
| 2019/0181754 | A1 * | 6/2019 | Ash | H03M 1/0602 |
| 2019/0386561 | A1 | 12/2019 | King | |

OTHER PUBLICATIONS

Combined Search and Examination Report under Sections 17 and 18(3), UKIPO, Application No. GB2200734.8, mailed Jul. 13, 2022.

* cited by examiner

CURRENT ESTIMATION IN A POWER CONVERTER

The present application is continuation of U.S. patent application Ser. No. 18/698,674, filed Apr. 4, 2024, which is a 371 of International Patent Application No. PCT/GB2022/053022, filed Nov. 29, 2022, which claims priority to U.S. patent application Ser. No. 17/699,269, filed Mar. 21, 2022, issued as U.S. Pat. No. 12,040,710 on Jul. 16, 2024, which claims priority to United Kingdom Patent Application No. 2200734.8, filed Jan. 20, 2022, which claims priority to U.S. Provisional Patent Application No. 63/292,177, filed Dec. 21, 2021, each of which is incorporated by reference herein in its entirety.

FIELD OF THE INVENTION

The present disclosure relates to estimation of current in a power converter such as a boost converter.

BACKGROUND

Portable electronic devices such as mobile phones, laptop and tablet computers, smartwatches etc. typically include a power source such as an on-board battery to power the various components and subsystems of the portable electronic device.

Some components or subsystems of a portable electronic device may require a supply voltage that is greater than the output voltage of the on-board battery. For example, in order to provide a desired output signal amplitude range for driving an output transducer (e.g. loudspeaker that is used to output sound such as music, speech and the like, a haptic transducer such as a resonant actuator, or an ultrasonic transducer) an amplifier subsystem may require a supply voltage that is greater than the maximum output voltage of the on-board battery.

Thus, a boost converter may be provided in such devices, to convert the output voltage of the on-board battery to a higher voltage that is suitable for use as a supply for such components and subsystems. A boost converter is sometimes referred to as a step-up converter in the art since it "steps up" the source voltage.

FIG. 1 provides a simplified schematic representation of example boost converter circuitry and a graph illustrating current flowing through an inductor of the boost converter circuitry in operation of the boost converter circuitry.

The boost converter circuitry (shown generally at 100 in FIG. 1) essentially includes an inductor 110, a reservoir capacitor 120, a first controllable switch device 130 (which in this example is an n-channel MOSFET), a second controllable switch device 140 (which in this example is a p-channel MOSFET), and control circuitry 150 for controlling the operation of the first and second controllable switch devices (referred to hereinafter simply as switches) 130, 140.

The inductor 110 is coupled in series between a positive terminal of a battery 160 or other power source of a host device (e.g. a mobile phone or the like) and a drain terminal of the first switch 130. A source terminal of the first switch 130 is coupled to a ground or other reference voltage supply rail (hereinafter referred to as ground, for simplicity), and a gate terminal of the first switch 130 is coupled to a first output of the control circuitry 150 so as to receive a control signal from the control circuitry 150.

A drain terminal of the second switch 140 is coupled to the inductor 110 and a source terminal of the second switch 140 is coupled to a first terminal of the reservoir capacitor 120. A gate terminal of the second switch 140 is coupled to a second output of the control circuitry 150 so as to receive a control signal from the control circuitry 150. The second terminal of the reservoir capacitor 120 is coupled to ground.

In operation of the boost converter circuitry 100, the first and second switches 130, 140 are controlled so as to repeatedly couple one terminal of the inductor 110 to ground and then to the reservoir capacitor 120, such that energy can be transferred from the inductor 110 to the reservoir capacitor 120 to increase a voltage $V_{RES}$ across the reservoir capacitor 120 to a level that is greater than an output voltage $V_{BATT}$ of the battery 160.

In a first, charging, phase $\Phi_1$ of operation of the circuitry 100, the control circuitry 150 outputs control signals to the first and second switches 130, 140 to switch the first switch 130 on, and to switch the second switch 140 off. Thus, during a first time period between a first time $t_0$ and a second time $t_1$, a current path exists from the battery 160 to ground through the inductor 110, and an increasing current $I_L$ flows through the inductor 110, as shown in the graph of FIG. 1. As a result of the increasing inductor current $I_L$, the inductor stores some energy by generating a magnetic field.

In a second, discharging, phase $\Phi_2$, of operation of the circuitry 100, the control circuitry 150 outputs control signals to the first and second switches 130, 140 to switch the first switch 130 off, and to switch the second switch 140 on. Thus, during a second time period between the second time $t_1$ and a third time $t_2$, current can no longer flow through the inductor 110 to ground through the first switch 130. The current in the inductor 110 must keep flowing, and therefore flows into the reservoir capacitor 120, causing the voltage $V_{RES}$ across the reservoir capacitor 120 to increase. If $V_{RES}$ is smaller than $V_{BATT}$ the current in the inductor 110 will continue to increase, hence charging the reservoir capacitor 120. If $V_{RES}$ is greater than $V_{BATT}$ the current in the inductor 110 will start decreasing, but because the current is still positive the voltage $V_{RES}$ across the reservoir capacitor 120 will continue to increase further.

By repeating the charging phase $\Phi_1$ and the discharging phase $\Phi_2$ a number of times, the reservoir capacitor 120 can be charged to a level at which the voltage $V_{RES}$ across the reservoir capacitor 120 is greater than the voltage $V_{BATT}$ output by the battery 160 and is thus suitable for supplying downstream components or subsystems such as amplifier circuitry or the like that require a greater voltage than can be provided by the battery 160 alone.

In a continuous conduction mode (CCM) of operation of the circuitry 100 (as illustrated in FIG. 2), each charging phase $\Phi_1$ is immediately followed by a discharging phase $\Phi_2$, and each discharging phase $\Phi_2$ is immediately followed by a charging phase $\Phi_1$. Thus, each operational cycle of the circuitry 100 consists of a charging phase $\Phi_1$ immediately followed by a discharging phase $\Phi_2$, such that there is a continuous inductor current during operation of the circuitry 100.

In contrast, in a discontinuous conduction mode (DCM) of operation of the circuitry 100 (as illustrated in FIG. 3), each discharging phase $\Phi_2$ is followed by a zero-current phase $\Phi_3$, during which both the first switch 130 and the second switch 140 are switched off, such that no current flows through the inductor 110. Thus, each operational cycle of the circuitry 100 consists of a charging phase Φ1 immediately followed by a discharging phase Φ2, immediately followed by a zero-current phase $\Phi_3$.

In many applications in which boost converter circuitry of the kind shown in FIG. 1 is employed, it is beneficial to be able to monitor the average current through the inductor per operational cycle of the circuitry 100 (hereinafter referred to as the "cycle average inductor current"), in order to regulate the cycle average inductor current in accordance with a target average current value, for example to prevent conditions in which an excessive amount of current is drawn from a battery or other power source.

SUMMARY

According to a first aspect, the invention provides current detection circuitry for generating an average inductor current signal indicative of an average inductor current during an operational cycle of power converter circuitry, the current detection circuitry comprising:

- circuitry for generating a peak inductor current signal indicative of a peak inductor current during the operational cycle; and
- circuitry for applying a ripple current estimate signal, indicative of an estimate of half of a ripple current in the power converter circuitry, to the peak inductor current signal to generate the average inductor current signal, wherein the ripple current is equal to a difference between the average inductor current and the peak inductor current.

The current detection circuitry may further comprise compensation circuitry configured to compensate, at least partially, for error in the ripple current estimate signal based on a comparison of the average inductor current signal and a monitored inductor current signal indicative of an actual inductor current in the power converter circuitry.

The compensation circuitry may be configured to determine whether the actual inductor current is greater or less than an average inductor current threshold represented by the average inductor current signal and to modify the ripple current estimate according to the determination.

The compensation circuitry may be configured to compare:

- a first period equal to half the duration of a charging or discharging phase of the power converter circuitry, to
- a second period equal to a time taken for the inductor current in the power converter circuitry to reach the average current threshold.

The compensation circuitry may be configured to compare:

- a first period equal to a duration of a charging or discharging phase of the power converter circuitry; to
- a second period equal to twice the time taken for the inductor current in the power converter circuitry to reach the average current threshold.

The compensation circuitry may comprise digital counter circuitry configured to generate a first count value indicative of the first period and a second count value indicative of the second period.

The compensation circuitry may further comprise digital comparison circuitry operative to compare the first count value to the second count value and to generate a comparator output signal based on the comparison.

The compensation circuitry may further comprise digital accumulator circuitry configured to increase or decrease the ripple current estimate based on the comparator output signal.

The compensation circuitry may further comprise current monitor circuitry configured to generate a signal indicative of the actual inductor current.

The circuitry for generating the peak inductor current signal may comprise control circuitry configured to receive a first signal indicative of a target output voltage and a second signal indicative of an actual output voltage of the power converter circuitry and to generate the peak inductor current signal based on the first and second received signals.

The circuitry for applying the ripple current estimate signal may be configured to generate and apply an additional DC voltage to the peak inductor current signal.

The compensation circuitry may be configured to modify the additional DC voltage.

The current detection circuitry may further comprise comparator circuitry configured to compare a signal indicative of an actual inductor current during operation of the power converter circuitry to a threshold that is based on the average inductor current signal.

The control circuitry, the circuitry for applying the ripple current estimate signal, and the comparator circuitry may form a control loop for regulating an output voltage of the power converter circuitry.

The current detection circuitry may further comprise circuitry for generating a scaling factor k, wherein the scaling factor k is a ratio of the total period of an operational cycle of the boost converter circuitry to an active period of the operational cycle, wherein an active period is a period in which current flows through the inductor during the operational cycle.

The control loop may further comprise multiplier circuitry for applying the scaling factor k to a signal within the control loop.

The current detection may further comprise divider circuitry outside of the control loop for applying the scaling factor k to a signal within the control loop.

The ripple current estimate signal may be based on a supply voltage to the power converter circuitry, an inductance of an inductor of the power converter circuitry and a charging period of the inductor.

The power converter circuitry may comprise boost converter circuitry.

According to a second aspect, the invention provides an integrated circuit comprising power converter circuitry according to the first aspect.

According to a second aspect, the invention provides a host device comprising circuitry according to the first aspect.

The host device may comprise a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console, a VR or AR device, a mobile telephone, a portable audio player or other portable device.

According to a fourth aspect, the invention provides current detection circuitry for generating an average inductor current signal indicative of an average inductor current during an operational cycle of power converter circuitry, the current detection circuitry comprising:

- circuitry for applying a ripple current estimate signal indicative of an estimate of half of a ripple current in the power converter circuitry to a peak inductor current signal, indicative of a peak inductor current during the operational cycle, wherein the ripple current is equal to a difference between the average inductor current and the peak inductor current,
- wherein the circuitry for applying the ripple current estimate signal comprises comparison circuitry for performing a comparison of a first period equal to half the duration of a charging phase of the power converter circuitry to a second period equal to a time taken for the inductor current in the power converter circuitry to reach the average current threshold, wherein the ripple current estimate signal is based, at least in part, on a result of the comparison.

According to a fifth aspect, the invention provides current detection circuitry for generating an average inductor current signal indicative of an average inductor current during an operational cycle of power converter circuitry operating in a discontinuous conduction mode, the current detection circuitry comprising:

circuitry for determining a scaling factor k, where k is a ratio of a total period of an operational cycle of the boost converter circuitry to an active period of the operational cycle, wherein an active period is a period in which current flows through the inductor during the operational cycle;

circuitry for applying the scaling factor to a signal in the boost converter circuitry to generate the average inductor current signal.

The circuitry for applying the scaling factor may comprise divider circuitry for applying the scaling factor to a signal indicative of the average inductor current during the active period of the operational cycle.

The current detection circuitry may comprise a control loop, and wherein the circuitry for applying the scaling factor comprises multiplier circuitry disposed within the control loop and configured to multiply an input signal thereto by the scaling factor to generate an output signal indicative of the average inductor current during the active period of the operational cycle, such that the input signal to the multiplier circuitry is the average inductor current signal.

According to a sixth aspect, the invention provides power converter circuitry comprising:

a control loop for regulating an output voltage of the power converter circuitry, the control loop comprising:

control circuitry configured to receive a first signal indicative of a target output voltage and a second signal indicative of an actual output voltage of the power converter circuitry and to generate a first loop variable based on the first and second received signals, wherein the first loop variable is indicative of a peak current threshold for the power converter circuitry;

DC voltage generator circuitry configured to generate an additional DC voltage, wherein the control loop is operative to modify the first loop variable using the additional DC voltage to generate a second loop variable, wherein the second loop variable is indicative of an average current threshold for the power converter circuitry;

current sense circuitry configured to generate a current sense signal indicative of a current through an inductor of the power converter circuitry; and comparator circuitry configured to compare the current sense signal to a threshold signal and to output a control signal for controlling a duty cycle of the power converter circuitry based on the comparison, wherein the threshold signal is based on the second loop variable.

BRIEF DESCRIPTION OF THE DRAWINGS

Embodiments of the invention will now be described, strictly by way of example only, with reference to the accompanying drawings, of which.

DETAILED DESCRIPTION

Figure 1:
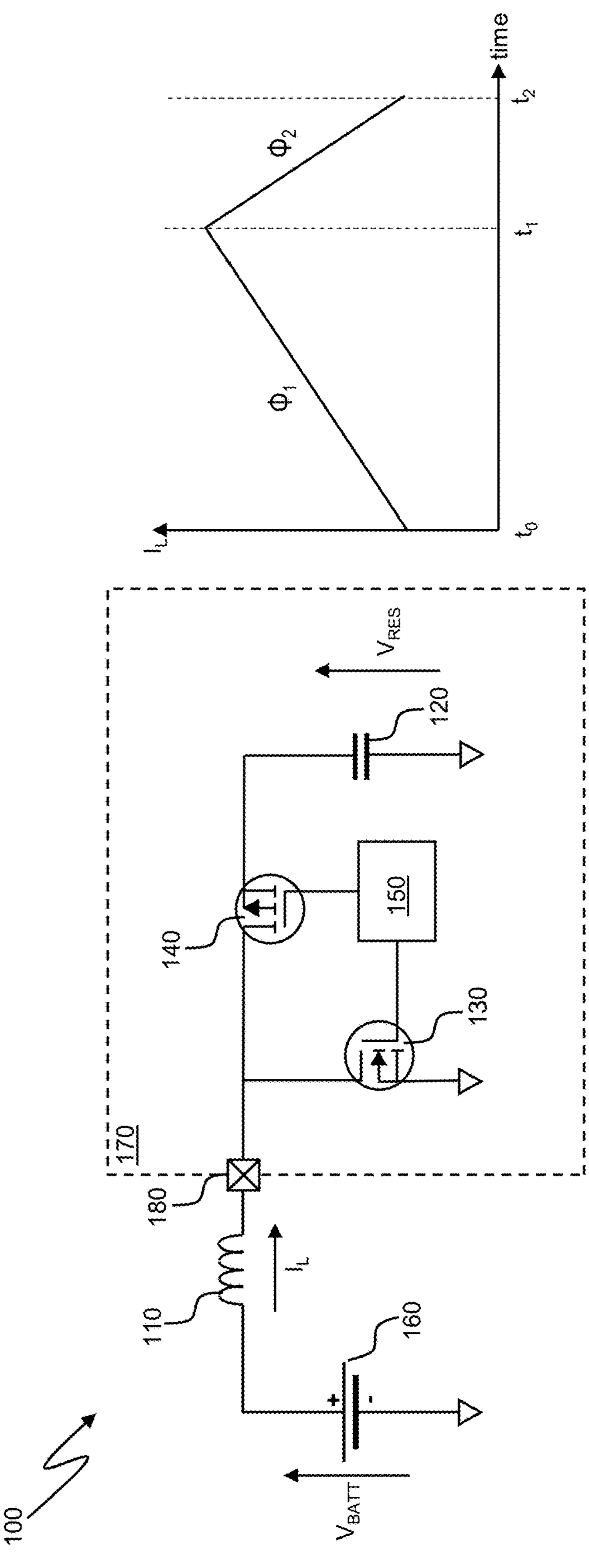
FIG. 1 is a simplified schematic representation of example boost converter circuitry and a graph illustrating current flowing through an inductor of the boost converter circuitry in operation of the boost converter circuitry.

In operation of boost converter circuitry of the kind shown in FIG. 1, an output voltage of the boost converter circuitry 100 may be regulated by altering the duty cycle of the first switch 130. For example, if the output voltage is lower than a target output voltage in one operational cycle of the boost converter circuitry, a control loop may increase a threshold level that is used to control the peak inductor current in one or more subsequent operational cycles in order to cause the first switch 130 to switch off later in the subsequent cycle(s), thus increasing the duty cycle of the first switch to increase the current through the inductor during the charging phase Φ1 in the subsequent cycle(s), thereby increasing the amount of energy that is stored in the inductor 110 and transferred to the capacitor 120 on an operational cycle by operational cycle basis, and therefore the output voltage and boost ratio (i.e. the ratio of the output voltage of the boost converter circuitry 100 to the voltage $V_{BATT}$).

Figure 4:
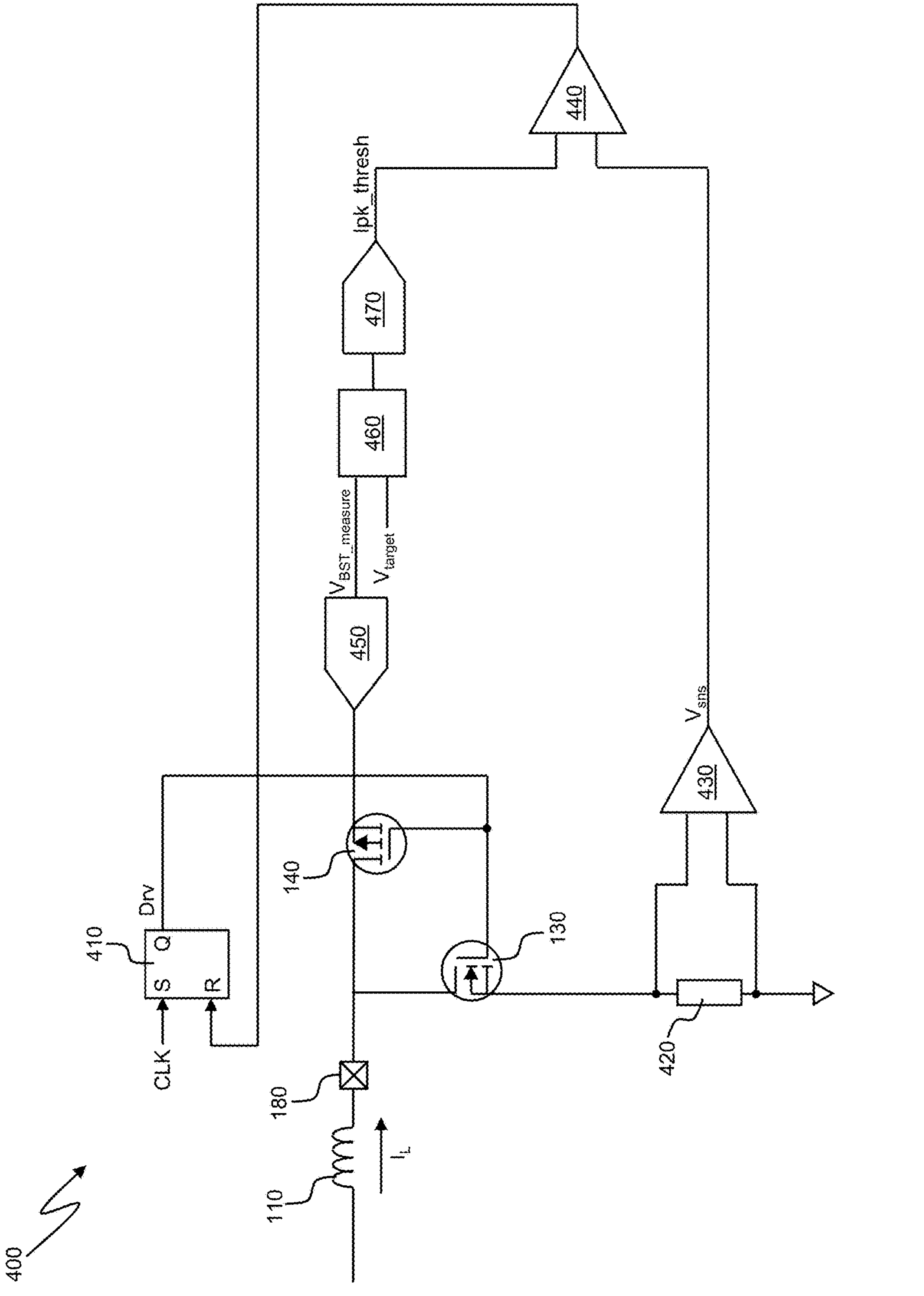
FIG. 4 is a schematic representation of boost converter circuitry having a control loop for regulating its output voltage.

FIG. 4 is a schematic representation of example boost converter circuitry having a control loop to regulate its output voltage.

The boost converter circuitry, shown generally at 400 in FIG. 4, includes a number of elements in common with the boost converter circuitry 100 of FIG. 1. Such common elements are denoted by common reference numerals and will not be described again here. Furthermore, in FIG. 4 and subsequent figures, where appropriate, the reservoir capacitor 120 is not shown, for reasons of clarity and brevity.

The boost converter circuitry 400 includes controller circuitry 410 for controlling the operation of the first and second switches 130, 140. In the example shown in FIG. 4 the controller circuitry 410 comprises SR flip flop circuitry having a set(S) input which receives a clock signal CLK, a reset (R) input, and an output Q which is coupled to the gate terminals of the first and second switches 130, 140 so as to provide a gate drive signal Drv to each of the first and second switches 130, 140. However, it will be appreciated by those of ordinary skill in the art that the controller circuitry 410 may be implemented in other ways. In particular, in some examples the controller circuitry 410 may be operative to control the operation of the first and second switches 130, 140 independently, by outputting a charging phase gate drive signal Drv_chg to the first switch 130 and outputting a discharging phase gate drive signal Drv_dischg (which is different from the charge gate drive signal Drv_chg) to the second switch 140.

The boost converter circuitry 400 further includes current sensing circuitry which, in the illustrated example, comprises a current sense resistance 420 (e.g. a resistor) and amplifier circuitry 430. Those of ordinary skill in the art will appreciate that other implementations of current sensing circuitry are possible.

The current sense resistance 420 is coupled between a source terminal of the first switch 130 of the boost converter circuitry 100 and a ground or other reference voltage supply. First and second inputs of the amplifier circuitry 430 are coupled to first and second terminals of the current sense resistance 420, and the amplifier circuitry 430 thus generates an output signal $V_{sns}$ indicative of an instantaneous current through the inductor 110 when the first switch 130 is turned on. An output of the amplifier circuitry 430 is coupled to a first input of comparator circuitry 440.

The boost converter circuitry 400 further includes analog to digital converter (ADC) circuitry 450 having an input coupled to the source terminal of the second switch 140 so as to receive the output voltage of the boost converter circuitry 400. The ADC circuitry 450 thus generates a digital output signal $V_{BST\_measure}$ representing the output voltage of the boost converter circuitry 400, which is stored on the reservoir capacitor 120 (not shown in FIG. 4).

An output of the ADC circuitry 450 is coupled to a first input of digital control circuitry 460, such that the digital control circuitry 460 receives the digital output signal $V_{BST\_measure}$ generated by the ADC circuitry 450. A second input of the digital control circuitry 460 receives a digital signal $V_{target}$ representing a target output voltage of the boost converter circuitry 100. The digital control circuitry 460 is operative to compare $V_{BST\_measure}$ to $V_{target}$ and to output a digital signal based on this comparison.

An output of the digital control circuitry 460 is coupled to an input of digital to analog converter (DAC) circuitry 470. The DAC circuitry 470 is configured to convert the digital signal output by the digital control circuitry 460 into an analog output voltage signal Ipk_thresh, which represents a peak inductor current threshold.

An output of the DAC circuitry 470 is coupled to a second input of the comparator circuitry 440, and an output of the comparator circuitry 440 is coupled to the reset (R) input of the controller circuitry 410.

The comparator circuitry 440 is thus operative to compare the instantaneous inductor current, as represented by $V_{sns}$, to the peak inductor current threshold, as represented by Ipk_thresh, and to output a control signal to the controller circuitry 410 based on the comparison.

Figure 5:
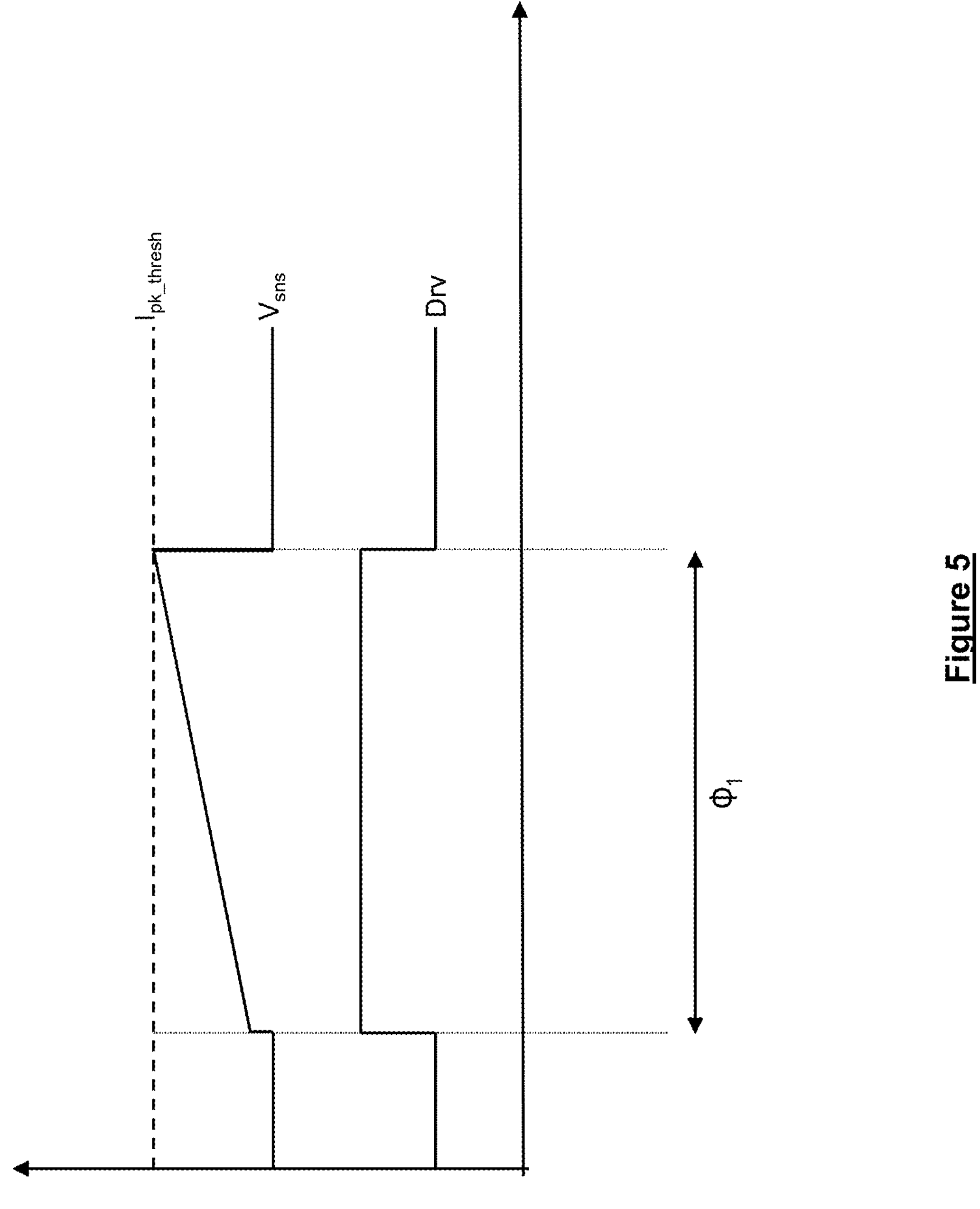
FIG. 5 is a schematic representation of signals in the boost converter circuitry of FIG. 4 during operation thereof.

As shown in the signal diagram of FIG. 5, in operation of the boost converter circuitry 400, in response to a first clock pulse of the clock signal CLK received at its set(S) input, the controller circuitry 410 outputs the gate drive signal Drv to switch on the first switch 130 to cause the inductor 110 to start charging. The signal $V_{sns}$ output by the amplifier circuitry 430 increases as the inductor current increases, and is compared by the comparator circuitry 440 to the signal Ipk_thresh output by the ADC circuitry 450.

When $V_{sns}$ meets Ipk_thresh, a signal output by the comparator circuitry 440 changes from a first state (e.g. a low logic state) to a second state (e.g. a high logic state), causing the controller circuitry 410 to stop outputting the gate drive signal Drv, causing the first switch 130 to switch off and the second switch 140 to switch on, to discharge the inductor 110 into a load (not illustrated) that is coupled to the boost converter circuitry 400.

The digital control circuitry 460 compares $V_{BST\_measure}$ (which is indicative of the output voltage of the boost converter circuitry 400) to $V_{target}$, and adjusts its output signal according to this comparison. For example, if $V_{BST\_measure}$ is less than $V_{target}$, the digital control circuitry 460 increases a value of its output signal such that Ipk_thresh is also increased. This has the effect of increasing the on-time of the first switch 130 (since, for a given level of inductor current at the beginning of a charging phase $\Phi_1$, the greater Ipk_thresh the longer it will take for $V_{SNS}$ to reach Ipk_thresh) and thus increasing the boost ratio of the boost converter circuitry 400. Conversely, if $V_{BST\_measure}$ is greater than $V_{target}$, the digital control circuitry 460 reduces the value of its output signal such that Ipk_thresh is also reduced, thereby reducing the on-time of the first switch 130 and thus reducing the boost ratio.

Thus the combination of the current sense circuitry (i.e. the resistance 420 and amplifier circuitry 430), comparator circuitry 440, ADC circuitry 450, digital control circuitry 460 and DAC circuitry 470 constitutes a control loop which is operative to control a duty cycle of the first switch 130 so as to regulate the output voltage of the boost converter circuitry 400 based on a loop variable, which in the example illustrated in FIG. 4 is the peak current threshold represented by the signal Ipk_thresh.

It may be advantageous to add additional components to the Ipk_thresh signal that are not associated with the output voltage control loop described above with reference to FIG. 4.

Figure 6:
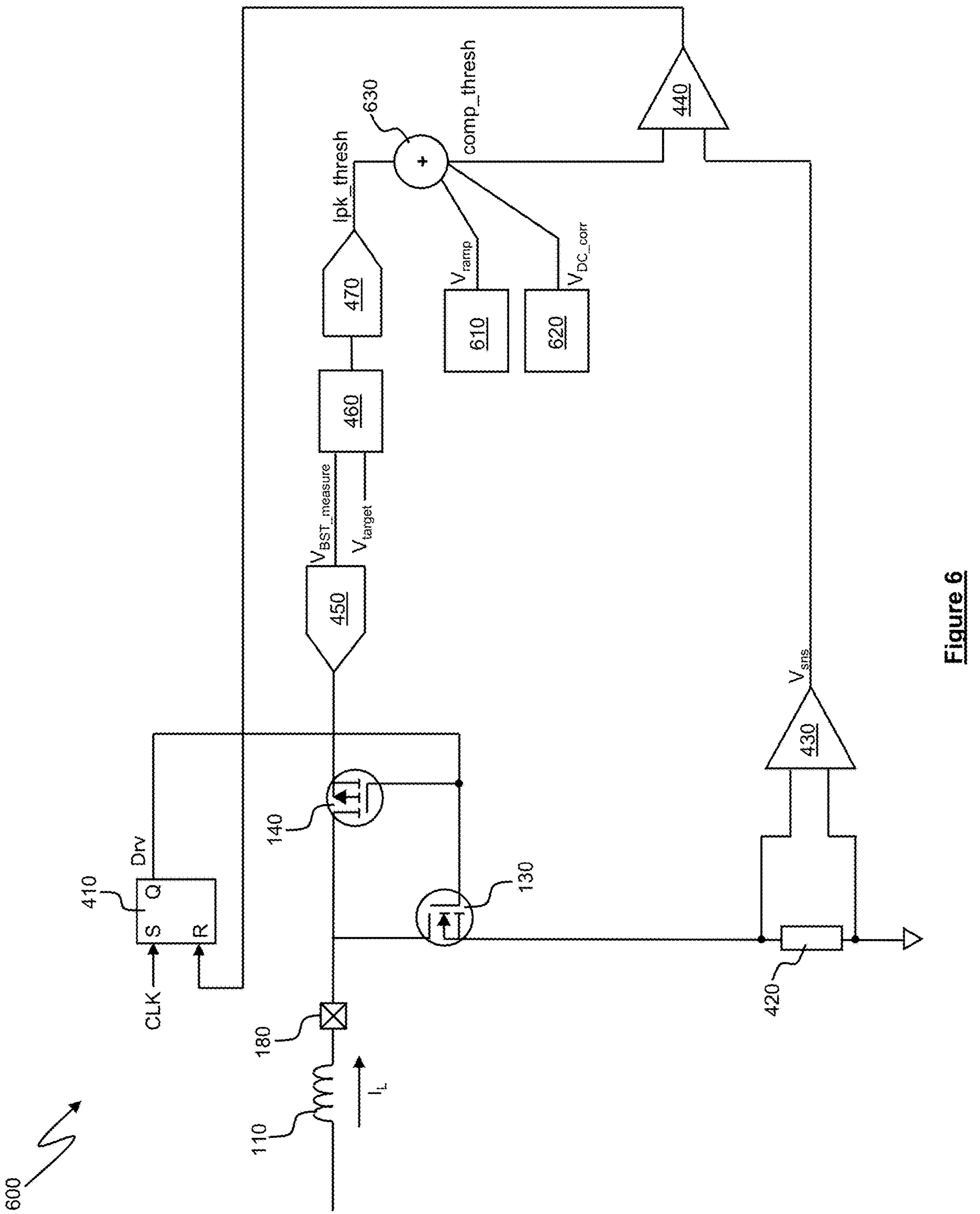
FIG. 6 is a schematic representation of alternative boost converter circuitry having a control loop.

FIG. 6 is a schematic representation of boost converter circuitry that includes circuitry for slope compensation to stabilise the response of the loop to any perturbation in the system.

The boost converter circuitry, shown generally at 600 in FIG. 6, includes a number of elements in common with the boost converter circuitry 400 of FIG. 4. Such common elements are denoted by common reference numerals in FIGS. 4 and 6, and will not be described again here.

Figure 7:
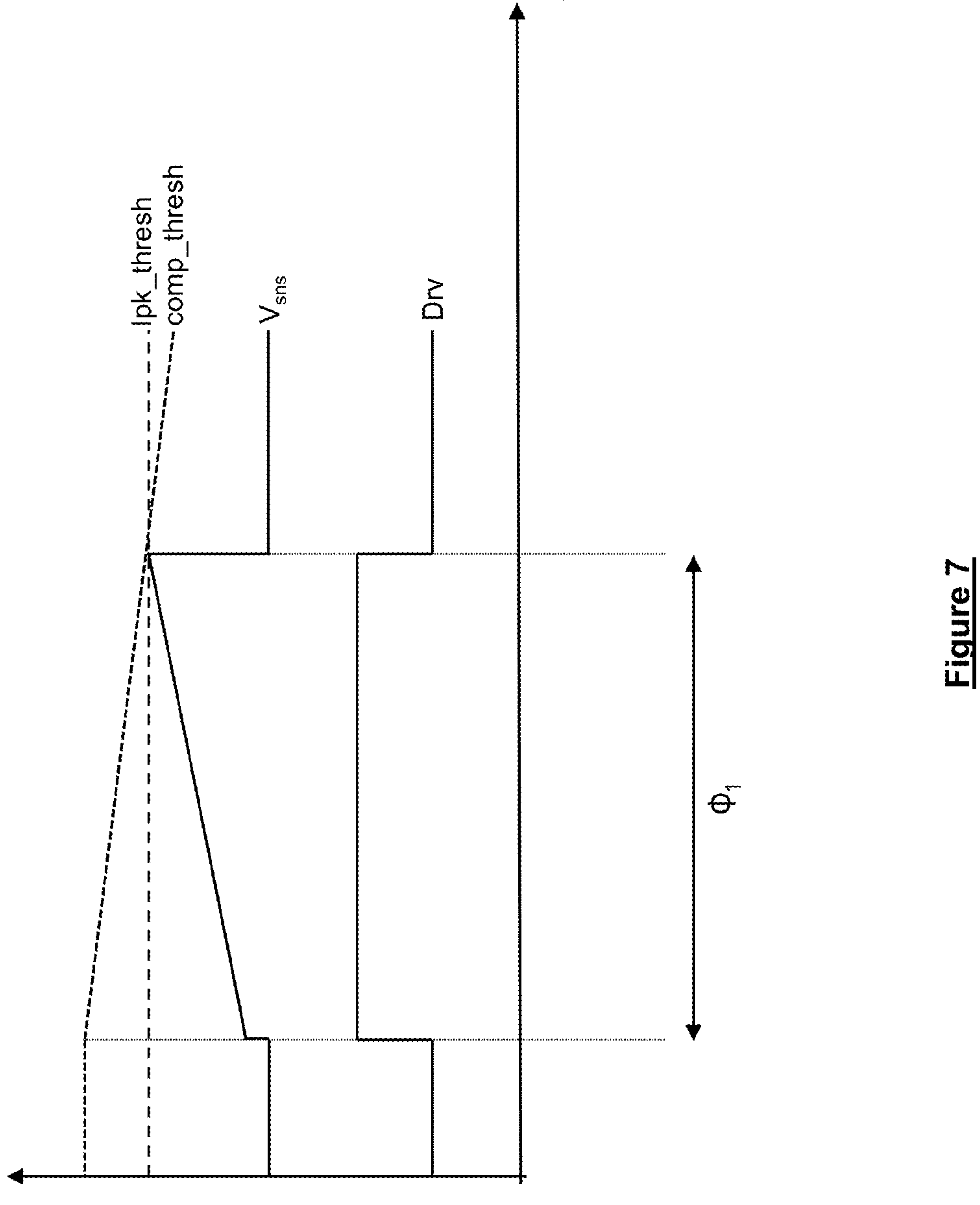
FIG. 7 is a schematic representation of signals in the boost converter circuitry of FIG. 6 during operation thereof.

The boost converter circuitry 600 includes ramp generator circuitry 610 configured to generate a ramp voltage $V_{ramp}$ that decreases over the course of an operational cycle of the boost converter circuitry 600, and DC correction voltage generator circuitry 620 configured to output a DC voltage $V_{DC\_corr}$. First adder circuitry 630 is configured to receive the Ipk_thresh signal from the DAC circuitry 470, the decreasing ramp voltage $V_{ramp}$, and the DC voltage $V_{DC\_corr}$, and to output a comparison threshold signal comp_ thresh. Thus, as shown in the signal diagram of FIG. 7, the signal comp_thresh reduces over time, but has a DC component (provided by the DC voltage $V_{DC\_corr}$) that brings comp_thresh up to the correct level for regulating the output voltage of the boost converter circuitry 600.

The comparator circuitry 440 in this example is thus operative to compare the instantaneous inductor current, as represented by $V_{sns}$, to the comparison threshold signal comp_thresh (which in this example is based on the peak inductor current threshold, as represented by Ipk_thresh, since comp_thresh is equal to Ipk_thresh+$V_{ramp}$+$V_{DC\_corr}$), and to output a control signal to the controller circuitry 410 based on the comparison.

In the example circuitry illustrated in FIG. 6, slope compensation is implemented by adding a decreasing ramp signal to the peak current threshold, but it will be appreciated by those of ordinary skill in the art that other approaches are possible. For example, in an alternative implementation an increasing ramp signal could be added to the signal $V_{sns}$ to achieve a similar slope compensation effect.

As will be appreciated, in the circuitry 600 the control loop again controls the duty cycle of the first switch 130 so as to regulate the output voltage of the boost converter circuitry 600 based on the peak current threshold represented by the signal Ipk_thresh.

In some applications it may be beneficial to compare the actual inductor current in boost converter circuitry to a requested or target average inductor current, to determine whether the actual inductor current is higher or lower than the requested average inductor current.

Figure 8:
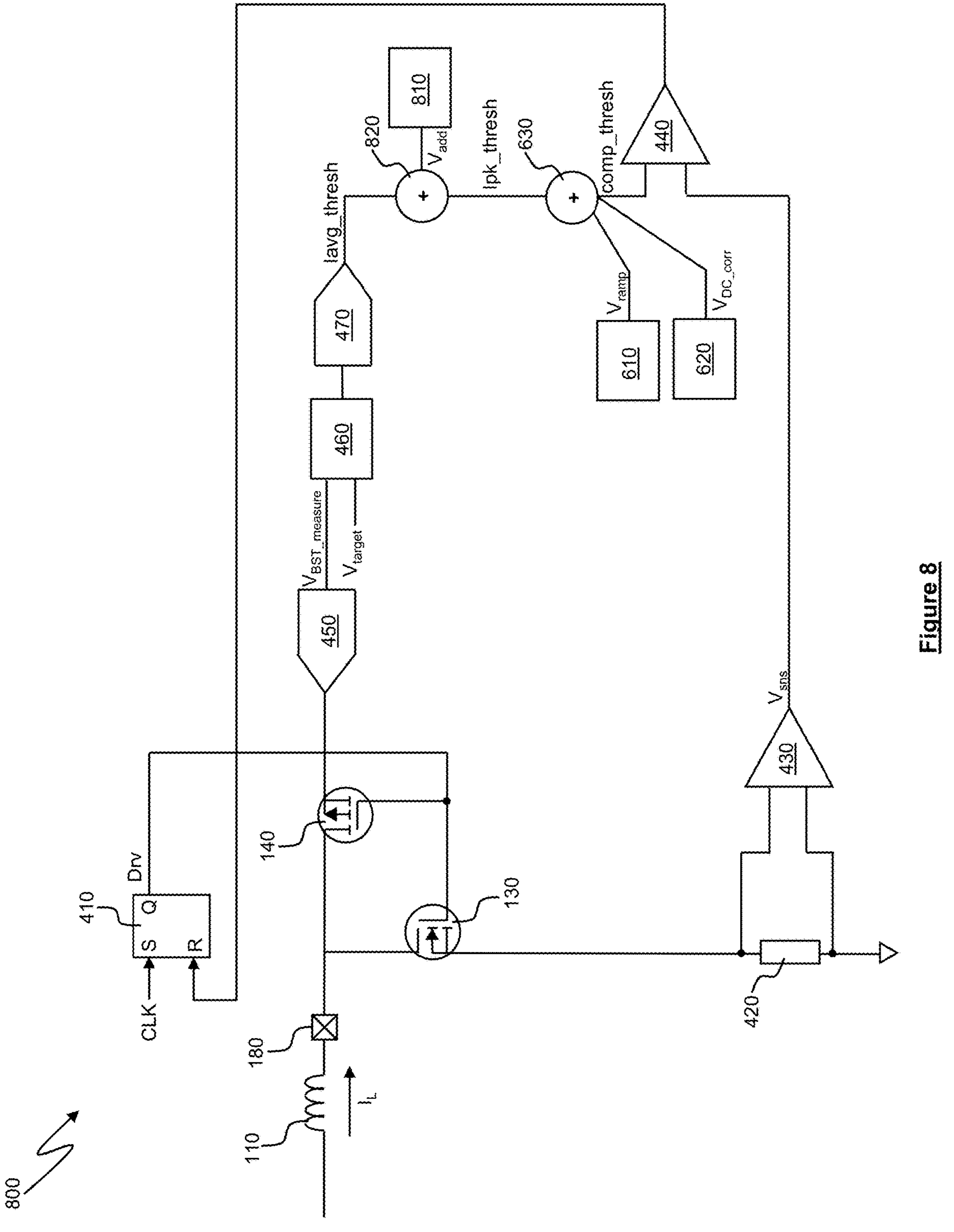
FIG. 8 is a schematic representation of further alternative boost converter circuitry having a control loop.

FIG. 8 is a schematic representation of boost converter circuitry that includes further additional circuitry for adding a DC voltage that is equal to the difference between the average inductor current and the peak inductor current, in order to produce a signal indicative of the requested or target average inductor current.

The boost converter circuitry, shown generally at 800 in FIG. 8, includes a number of elements in common with the boost converter circuitry 600 of FIG. 6. Such common elements are denoted by common reference numerals in FIGS. 6 and 8, and will not be described again here. It is to be noted that the slope compensation circuitry (e.g. the ramp generator circuitry 610 and the DC correction voltage generator circuitry 620 of FIG. 6) could be omitted from the boost converter circuitry 800.

The boost converter circuitry 800 includes additional DC voltage generator circuitry 810 and second adder circuitry 820 for adding an additional DC voltage $V_{add}$, corresponding to a difference between the average inductor Iavg current in an operational cycle of the boost converter circuitry 800 and a peak inductor current Ipk in the operational cycle, to the signal output by the DAC circuitry 470.

The difference between the average inductor current Iavg and the peak inductor current can be calculated as half of a ripple current Iripple. The ripple current Iripple in steady state operation of the boost converter circuitry is defined by the voltage $V_{BATT}$, the inductance of the inductor 110 and the charging period of the inductor 110. These quantities are known (to at least a first order approximation) by the digital control circuitry 460, which can thus estimate the ripple current Iripple, and hence the difference between the average inductor current and the peak inductor current can be estimated by the digital control circuitry 460 as Iripple/2. The digital control circuitry 460 can thus control the additional DC voltage generator circuitry 810 to generate and output the additional DC voltage $V_{add}$ based on the Iripple/2 estimate.

The addition of the additional DC voltage $V_{add}$ and the operation of the control loop cause the digital control circuitry 460 to modify its output signal, reducing it to a level that is representative of an average current threshold, rather than the peak current threshold, which is instead represented by the signal output by the second adder circuitry 820. Thus (once the control loop has settled to a steady state), a signal Iavg_thresh representing an average inductor current is output by the DAC circuitry 470, a signal Ipk_thresh (which is equal to Iavg_thresh+$V_{add}$) is output by the second adder circuitry 820, and a comparison threshold signal comp_thresh (which is equal to Iavg_thresh+$V_{add}$+$V_{ramp}$+$V_{DC\_corr}$) is output by the first adder circuitry 630. Alternatively (and equivalently), a single instance of adder circuitry with four inputs may replace the first and second adder circuitry 630, 820. This four-input adder circuitry would receive the signals Iavg_thresh, $V_{add}$, $V_{ramp}$, $V_{DC\_corr}$ and output the comparison threshold signal comp_thresh.

The comparator circuitry 440 in this example is thus operative to compare the instantaneous inductor current, as represented by $V_{sns}$, to the comparison threshold signal comp_thresh (which in this example is based on the average inductor current threshold, as represented by Iavg_thresh, since the comparison threshold signal comp_thresh is equal to the sum of Iavg_thresh+$V_{add}$+$V_{ramp}$+$V_{DC\_corr}$), and to output a control signal to the controller circuitry 410 based on the comparison.

Thus, in the circuitry 800, the control loop is again operative to control the duty cycle of the first switch 130 so as to regulate the output voltage of the boost converter circuitry 600 based on a loop variable, but in this example the loop variable is the average current threshold represented by the signal Iavg_thresh, rather than the peak current threshold represented by the signal Ipk_thresh.

The estimate of Iripple/2 will have a degree of error or inaccuracy, for reasons such as a tolerance in the rated inductance of the inductor 110, derating of the inductor 110 and/or error in the measurement of $V_{BATT}$, and so the signal Iavg_thresh will not represent the actual average inductor current Iavg with complete accuracy.

FIG. 8 shows one example of circuitry which uses an estimate of Iripple/2 in order to produce a signal indicative of a requested or target average inductor current from a signal that is indicative of a peak current, but those of ordinary skill in the art will readily understand that alternative circuitry could also be used to achieve the same effect. Such alternative circuitry need not include a control loop, but may instead operate in an open-loop manner, for example. Thus it is to be understood that the invention is not limited to the specific example illustrated in FIG. 8, but encompasses any circuitry that applies an estimate of Iripple/2 in order to produce a signal indicative of a requested or target average inductor current.

Figure 9:
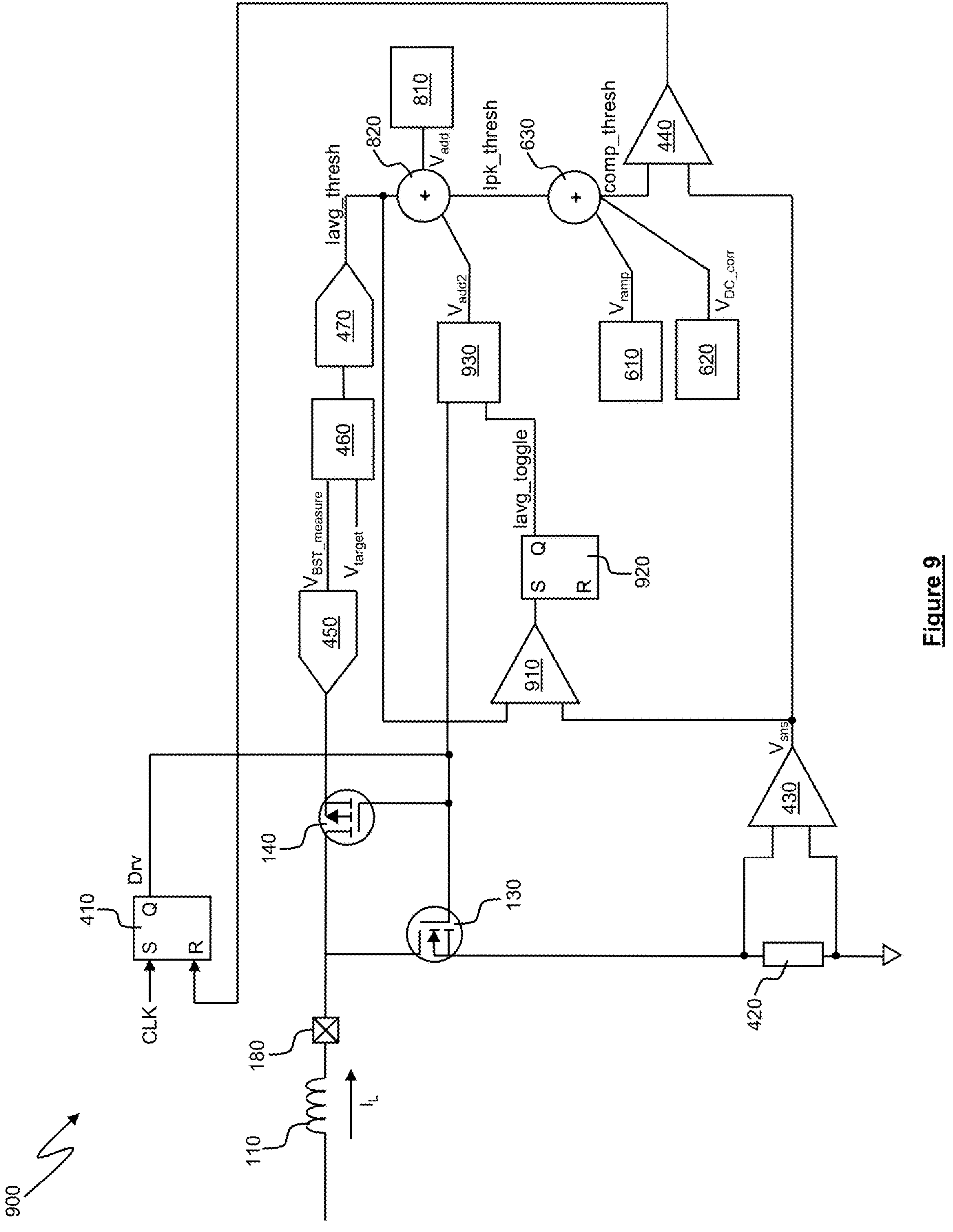
FIG. 9 is a schematic representation of further alternative boost converter circuitry having a control loop.

FIG. 9 is a schematic representation of boost converter circuitry that includes circuitry for compensating, at least partially, for error in the estimate of Iripple/2 such that the signal Iavg_thresh is a more accurate representation of the actual average inductor current.

The boost converter circuitry, shown generally at 900 in FIG. 9, includes a number of elements in common with the boost converter circuitry 800 of FIG. 8. Such common elements are denoted by common reference numerals in FIGS. 8 and 9, and will not be described again here. Again, the ramp generator circuitry 610 and the DC correction voltage generator circuitry 620 could be omitted from the boost converter circuitry 800.

The boost converter circuitry 900 includes comparator circuitry 910 configured to compare the signal $V_{sns}$ output by the amplifier circuitry 430 (which is indicative of the instantaneous current through the inductor 110) to the signal Iavg_thresh output by the DAC circuitry 470 (which is indicative of an average current threshold for the boost converter circuitry 900) and to output a comparator output signal when the level of the signal $V_{sns}$ meets (i.e. is equal to) the level of the signal Iavg_thresh.

In the example shown in FIG. 9, an output of the comparator circuitry 910 is coupled to an input of latch circuitry 920 which, in the illustrated example, comprises SR flip-flop circuitry. The latch circuitry 920 is configured to output a latch output signal Iavg_toggle to an input of digital comparison circuitry 930 when the comparator output signal is received at the input of the latch circuitry 920, indicating that the current through the inductor 110 has reached the average current threshold. In other implementations the latch circuitry 920 may be omitted and the output of the comparator circuitry 910 may be coupled to the input of the digital comparison circuitry 930.

The digital comparison circuitry 930, which is operative to compare a time taken for the current through the inductor 110 (as indicated by either the latch output signal Iavg_toggle or the comparator output signal) to reach the average current threshold to a period of time equal to half of the duration of the gate drive signal Drv that causes the first switch 130 to switch on. Thus the digital comparison circuitry 930 is operative to compare the requested or target average inductor current to the actual inductor current to determine whether the actual average inductor current is higher or lower than the requested or target average inductor current.

Based on the comparison, the digital comparison circuitry outputs a second additional DC voltage Vadd2 to the second adder circuitry 820, to cause the digital control circuitry 460 to further modify its output signal, as will now be explained with reference to FIG. 10, which is a schematic representation of example circuitry for implementing the digital comparison circuitry 930 of FIG. 9.

Figure 10:
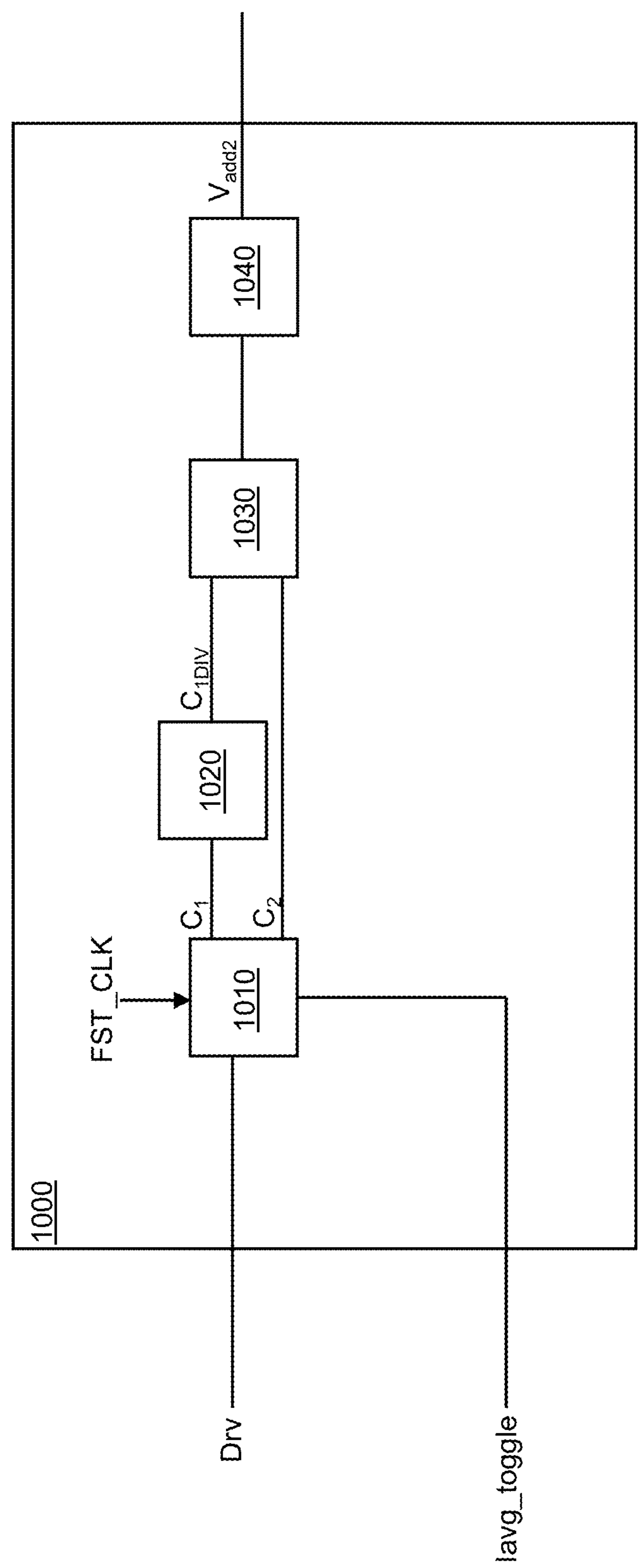
FIG. 10 is a schematic representation of digital comparison circuitry for the boost converter circuitry of FIG. 9.

The digital comparison circuitry, shown generally at 1000 in FIG. 10, comprises digital counter circuitry 1010 configured to receive, at a clock input terminal, a relatively fast clock signal FST_CLK, having a clock frequency $F_{CLK}$, from a clock signal generator (not shown in FIG. 10), which may be part of the digital comparison circuitry 930 or may be external to the digital comparison circuitry 930, and to generate an output count value indicative of the number of clock pulses of the clock signal FST_CLK that have been counted in a given period of time. The digital counter circuitry 1010 also includes first and second input terminals. In use of the circuitry 1000, the first input terminal is coupled to the output of the controller circuitry 410 so as to receive the gate drive signal Drv output by the controller circuitry 410, and the second input terminal is coupled to the output of the latch circuitry 920 so as to receive the Iavg_toggle signal.

A first output of the digital counter circuitry 1010 is coupled to an input of digital divider circuitry 1020 such that the digital divider circuitry 1020 receives a first count value $C_1$, output by the digital counter circuitry 1010, and indicative of a duration of the charging phase $\Phi_1$ of the boost converter circuitry 900. The digital divider circuitry 1020 is configured to divide the count value received from the digital counter circuitry 1010 by two, and to output a divided count value $C_{1DIV}$.

An output of the digital divider circuitry 1020, which outputs the divided count value $C_{1DIV}$, is coupled to a first input of digital comparator circuitry 1030. A second input of the digital comparator circuitry 1030 is coupled to a second output of the digital counter circuitry 1010 so as to receive a second count value $C_2$, indicative of the time taken for the inductor current to reach the average current threshold level represented by the signal Iavg_thresh.

An output of the digital comparator circuitry 1030 is coupled to an input of digital accumulator circuitry 1040, which generates an accumulator output as the second additional DC voltage $V_{add2}$.

Figure 11:
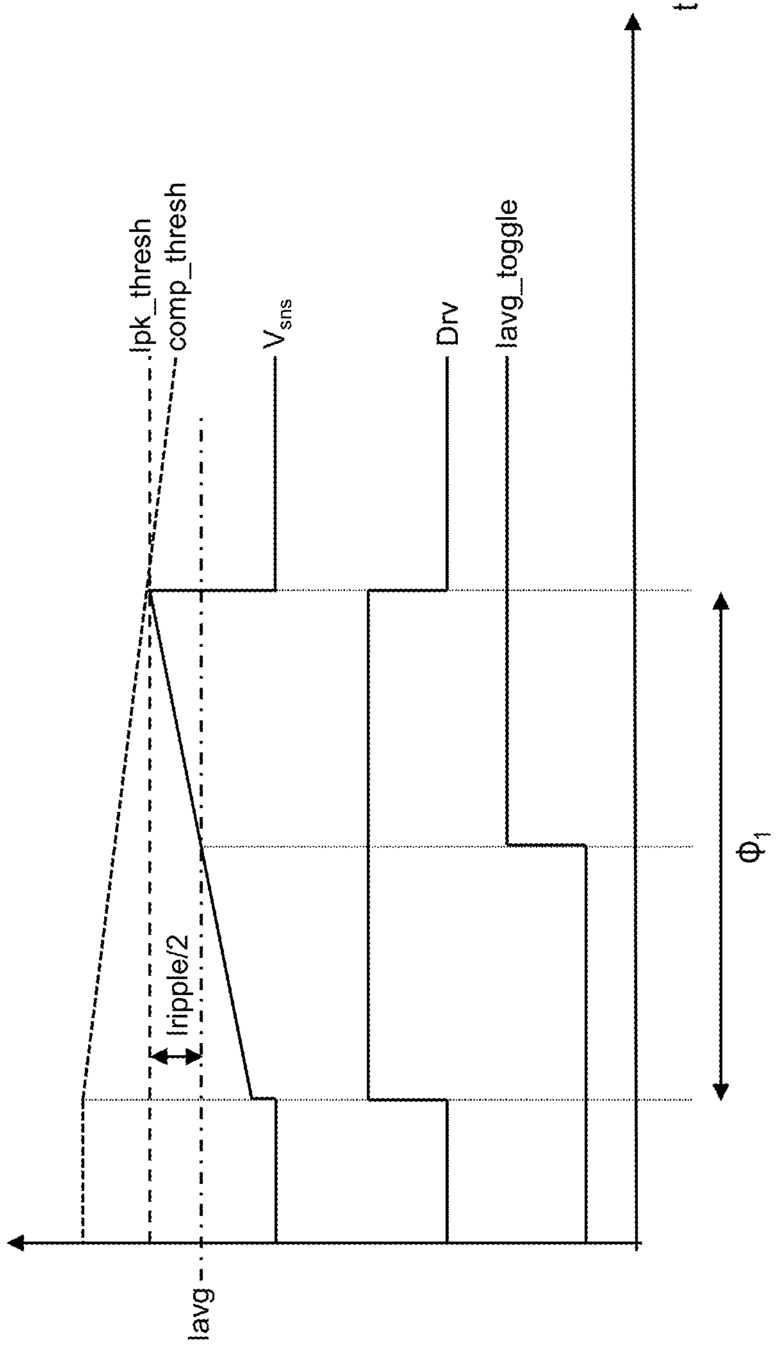
FIG. 11 is a schematic representation of signals in the boost converter circuitry of FIG. 9 during operation thereof.

If it is assumed that the current through the inductor 110 increases linearly during the charging phase $\Phi_1$, the instantaneous current through the inductor 110 will reach the cycle average inductor current level Iavg exactly half way through the charging phase $\Phi_1$. Thus if the average current threshold (represented by the signal Iavg_thresh) is accurate (in the sense that it is equal to the actual cycle average inductor current Iavg), then Iavg_toggle will be output by the latch circuitry 920 at a point in time exactly half way through the charging phase $\Phi_1$ as shown in the signal diagram of FIG. 11. If Iavg_toggle is output by the latch circuitry 920 before half the duration of the charging phase $\Phi_1$ has elapsed, then the average current threshold is too low and should be increased, whereas if Iavg_toggle is output by the latch circuitry 920 after half the duration of the charging phase $\Phi_1$ has elapsed, then the average current threshold is too high and should be decreased.

Thus, by comparing the time taken for the Iavg_toggle signal to be output by the latch circuitry 920 to half of the duration of the charging phase $\Phi_1$, a difference between the average current threshold (represented by the signal Iavg_thresh) and the actual cycle average inductor current Iavg can be determined, and the result of this determination can be used to compensate for error in the estimate of Iripple/2, to make the signal Iavg_thresh a more accurate representation of the actual cycle average inductor current.

In operation of the circuitry 1000, the digital counter circuitry 1010 commences counting clock pulses for a particular operational cycle of the boost converter circuitry 900 when it receives the gate drive signal Drv output by the controller circuitry 410 controller circuitry 410 to turn the first switch 130 on at the beginning of the particular operational cycle. Thus the digital counter circuitry 1010 commences counting clock pulses at the beginning of the particular operational cycle of the boost converter circuitry 900.

The digital counter circuitry 1010 stops counting clock pulses for the particular operational cycle when it stops receiving the gate drive signal Drv (i.e. when the first switch 130 is switched off at the end of the charging phase $\Phi_1$) and outputs (e.g. to an internal register of the digital counter circuitry 1010, or to a register external to the digital counter circuitry 1010) a count value that has been reached at this point in time.

Thus, the digital counter circuitry 1010 generates and outputs a first count value $C_1$ that is indicative of the duration of the charging phase $\Phi_1$ of the boost converter circuitry 900.

The digital counter circuitry 1010 also receives the signal Iavg_toggle output by the latch circuitry 920, and outputs (e.g. to an internal register of the digital counter circuitry 1010, or to a register external to the digital counter circuitry 1010) a count value that has been reached at this point in time.

Thus, the digital counter circuitry 1010 generates and outputs a second count value $C_2$ that is indicative of the time taken for the inductor current to reach the average current threshold level represented by the signal Iavg_thresh.

The digital comparator circuitry 1030 compares the second count value $C_2$ to the divided count value $C_{1DIV}$ to determine a difference between the time taken for the Iavg_toggle signal to be output by the latch circuitry 920 and half of the duration of the charging phase $\Phi_1$. If the second count value $C_2$ is greater than the divided count value $C_{1DIV}$ (indicating that Iavg_toggle is output after half the charging phase $\Phi_1$ has elapsed), the digital comparator circuitry 1030 outputs a signal to cause the digital accumulator circuitry 1040 to increase $V_{add2}$, thus causing Iavg_thresh to decrease (as a result of the action of the control loop), whereas if the second count value $C_2$ is less than the divided count value $C_{1DIV}$ (indicating that Iavg_toggle is output before half the charging phase $\Phi_1$ has elapsed), the digital comparator circuitry 1030 outputs a signal to cause the digital accumulator circuitry 1040 to decrease $V_{add2}$, thus causing Iavg_thresh to increase (as a result of the action of the control loop).

Thus the circuitry of FIG. 10 is able to compensate for error in the estimate of Iripple/2 by increasing or decreasing the second additional DC voltage $V_{add2}$, so as to bring the average inductor current threshold closer to the actual average cycle inductor current Iavg, such that the signal Iavg_thresh is a more accurate representation of the actual cycle average inductor current Iavg.

In an alternative example the first output of the digital counter circuitry 1010 could be coupled directly to the first input of the digital comparator circuitry 1030, such that the first count value $C_1$ is not divided by two (and is therefore representative of the duration of the charging phase $\Phi_1$) and a digital multiplier could be provided between the second output of the digital counter circuitry 1010 and the second input of the digital comparator circuitry 1030, to multiply the second count value $C_2$ by two to generate a multiplied count value $C_{2mult}$ (representative of time taken for the inductor current to reach the average current threshold level represented by the signal Iavg_thresh) that is output to the second input of the digital comparator circuitry 1030. As will be appreciated, comparing the undivided first count value $C_1$ to the multiplied count value $C_{2mult}$ is equivalent to comparing the divided count value $C_{1DIV}$ to the original second count value $C_2$.

As will be appreciated by those of ordinary skill in the art, in an alternative approach the time taken for the inductor current to fall to Iavg during the discharging phase $\Phi_2$ could be compared to half the duration of the discharging phase $\Phi_2$. If it is assumed that the current through the inductor 110 decreases linearly during the discharging phase $\Phi_2$, the instantaneous current through the inductor 110 will reach the cycle average inductor current level Iavg exactly half way through the discharging phase $\Phi_2$. Thus, instead of comparing the time for the instantaneous inductor current to reach Iavg to half the period of the charging phase $\Phi_1$, the digital comparator circuitry 1030 could instead compare the time taken for the instantaneous inductor current to fall to or below Iavg to half the period of the discharging phase $\Phi_1$ to determine if the average current is too low or too high, and output appropriate signals to cause the digital accumulator circuitry 1040 to increase or decrease $V_{add2}$ as necessary.

As will be appreciated by those of ordinary skill in the art, the signal Iavg_thresh generated by the boost converter circuitry 800, 900 of FIGS. 8 and 9 is indicative of the average inductor current over the combined duration of the charging and discharging phases $\Phi_1$, $\Phi_2$ when the boost converter circuitry 800, 900 is operating in continuous conduction mode (CCM).

However, for boost converter circuitry operating in discontinuous conduction mode (DCM), the signal Iavg_thresh is not indicative of the average inductor current over the whole of an operational cycle of the boost converter circuitry, i.e. the combined duration of the charging, discharging and zero-current phases $\Phi_1$, $\Phi_2$, $\Phi_3$, but is instead indicative of the average inductor current over the charging and discharging phases $\Phi_1$, $\Phi_2$. As will be appreciated by those of ordinary skill in the art, the effect of the additional zero current phase $\Phi_3$ is to reduce the cycle average inductor current when the boost converter circuitry is operating in DCM, as compared to the cycle average inductor current when the boost converter is operating in CCM, but the signal Iavg_thresh will not be indicative of this reduced cycle average inductor current when the boost converter circuitry 900 is operating in DCM.

In some applications it may be beneficial for the signal Iavg_thresh to reflect the average inductor current over the whole of an operational cycle of the boost converter circuitry, i.e. the combined duration of the charging, discharging and zero-current phases $\Phi_1$, $\Phi_2$, $\Phi_3$ (i.e. over the period from $t_0$ to $t_3$ in FIG. 3), hereinafter referred to as the "DCM cycle average inductor current" when the boost converter circuitry 800, 900 is operating in DCM, rather than the average inductor current over the whole of an operational cycle of the boost converter circuitry.

This can be achieved by applying a scaling factor k to a signal in the boost converter circuitry, as will be discussed below with reference to FIGS. 12-14.

The scaling factor k is a ratio of the total period of an operational cycle of the boost converter circuitry to an "active period" of the operational cycle, where an "active period" is the period in which current flows through the inductor 110 during the operational cycle.

Figure 3:
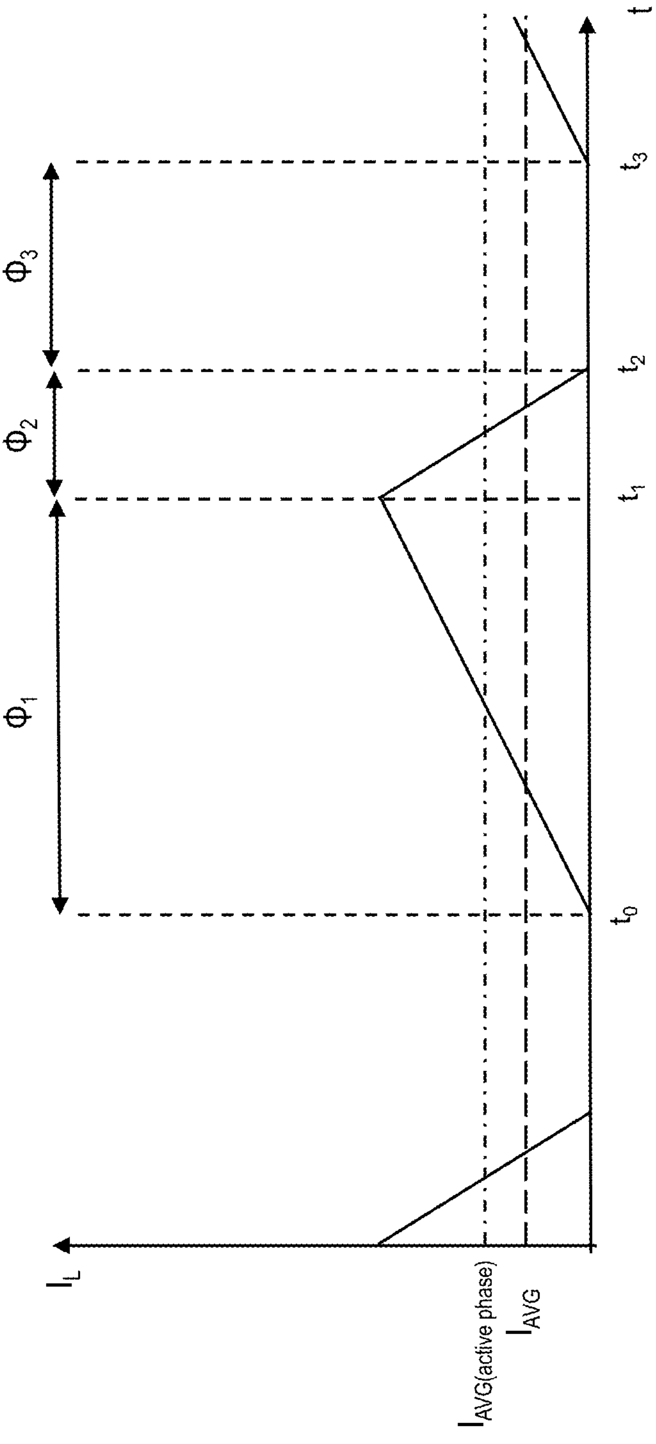
FIG. 3 is a graph illustrating current through the inductor of the boost converter circuitry of FIG. 1 during operation in a discontinuous conduction mode.

The scaling factor k exactly matches a ratio of the average inductor current over the total period of an operational cycle of the boost converter circuitry (shown as $I_{AVG}$ in FIG. 3) to the average inductor current in the active period of the operational cycle (shown as $I_{AVG(active\ phase)}$ in FIG. 3). By measuring the duration of the total period of an operational cycle and the duration of the active period of the operational cycle, the scaling factor k can be calculated, and this enables the calculation of the average inductor current over the total period of an operational cycle of the boost converter circuitry based on the average inductor current in the active period of the operational cycle.

Figure 2:
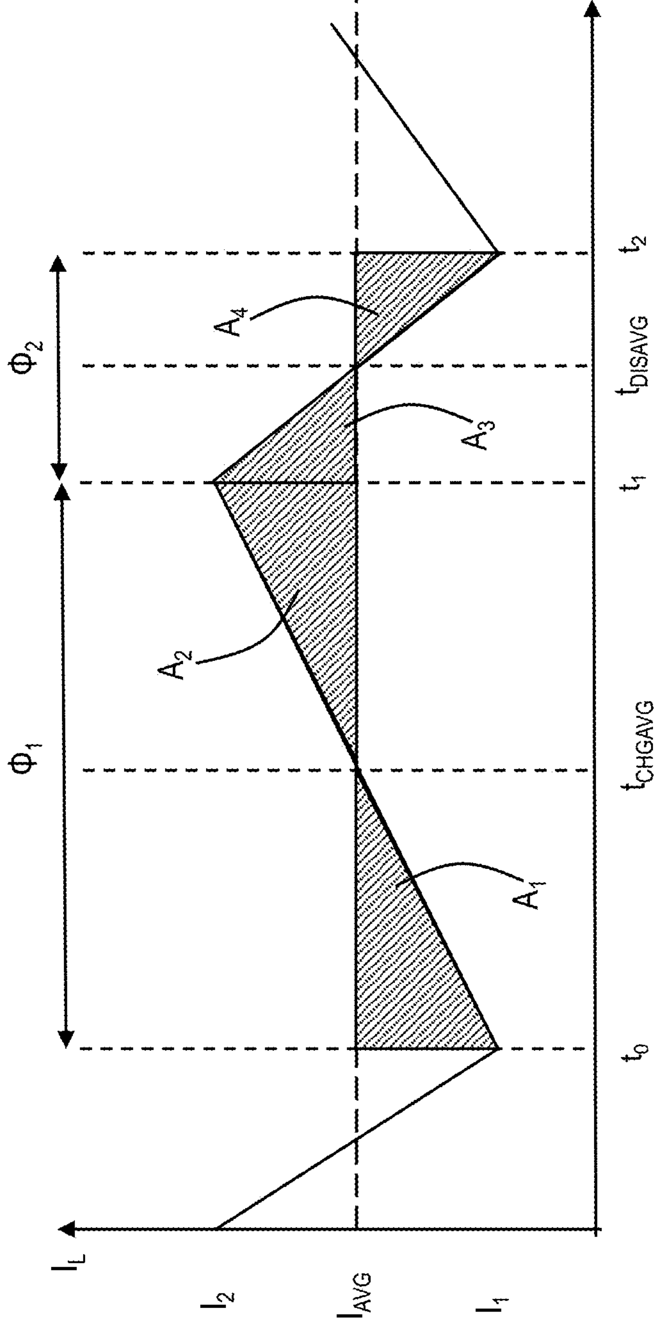
FIG. 2 is a graph illustrating current through the inductor of the boost converter circuitry of FIG. 1 during operation in a continuous conduction mode.

When the boost converter circuitry is operating in CCM, the total period of an operational cycle is equal to the duration of the period from $t_0$ to $t_2$ in FIG. 2, i.e. the sum of the durations of the charging and discharging phases $\Phi_1$, $\Phi_2$. Because in CCM current continuously flows in the inductor 110, the active period of the operational cycle is also equal to the duration of the period from $t_0$ to $t_2$ in FIG. 2, and so in CCM $k=(t_3-t_0)/(t_2-t_0)=1$.

In contrast, when the boost converter circuitry is operating in DCM, the total period of an operational cycle is equal to the duration of the period from $t_0$ to $t_3$ in FIG. 3, i.e. the sum of the durations of the charging, discharging and zero-current phases $\Phi_1$, $\Phi_2$, $\Phi_3$. However, in DCM no current flows in the inductor 110 during the zero-current phase $\Phi_3$, and so the active period of the operational cycle is equal to the duration of the period from $t_0$ to $t_2$ in FIG. 3, and so in DCM $k=(t_3-t_0)/(t_2-t_0)>1$.

Figure 12:
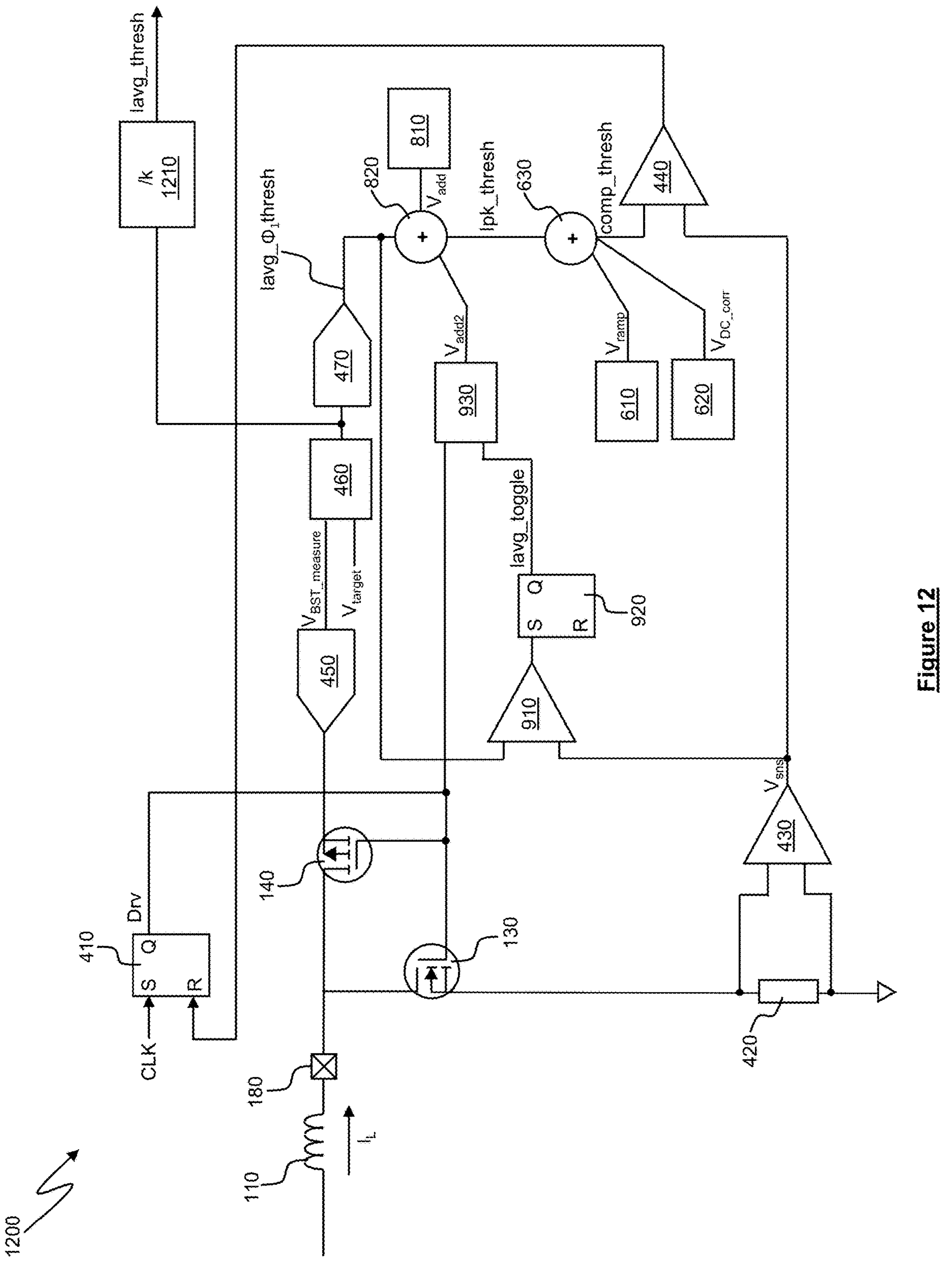
FIG. 12 is a schematic representation of boost converter circuitry including circuitry configured to generate a signal indicative of a cycle average inductor current over a whole operating cycle when the boost converter circuitry is operating in DCM.

FIG. 12 is a schematic representation of boost converter circuitry that includes circuitry for compensating for the effect of the zero-current phase $\Phi_3$ when the boost converter circuitry is operating in DCM, to generate a signal Iavg_thresh that is indicative of the DCM cycle average inductor current.

The boost converter circuitry, shown generally at 1200 in FIG. 12, includes a number of elements in common with the boost converter circuitry 900 of FIG. 9. Such common elements are denoted by common reference numerals in FIGS. 9 and 11, and will not be described again here.

The boost converter circuitry 1300 additionally includes divider circuitry 1210 coupled to the output of the digital control circuitry 460 and configured to divide a digital signal Iavg_$\Phi_1$thresh, indicative of the average inductor current over the charging and discharging phases $\Phi_1$, $\Phi_2$ during operation of the boost converter circuitry 1200 in DCM, by the scaling factor k, so as to generate a digital signal Iavg_thresh that is indicative of the DCM cycle average inductor current.

It will be recalled that the digital counter circuitry 1010 commences counting clock pulses for a first operational cycle of the boost converter circuitry 900 when it receives the gate drive signal Drv output by the controller circuitry 410 to turn the first switch 130 on at the beginning of the first operational cycle in order to generate and output the first and second count values $C_1$, $C_2$.

The digital counter circuitry 1010 may also generate a third count value $C_3$ that is indicative of the total period of an operational cycle of the boost converter circuitry, by outputting (e.g. to an internal register of the digital counter circuitry 1010, or to a register external to the digital counter circuitry 1010) the count value that has been reached the next time the digital counter circuitry 1010 receives the gate drive signal Drv to turn the first switch 130 on again at the beginning of a second operational cycle immediately following the first operational cycle.

Alternatively, if the frequency of the clock signal CLK received by the controller circuitry 410 is a known fixed division of the clock signal FST_CLK received by the digital counter circuitry, the third count value $C_3$ may be known and stored, e.g. in a suitable register internal or external to the digital counter circuitry 1010. As will be apparent from the foregoing discussion, when the boost converter circuitry is operating in DCM, the third count value $C_3$ is indicative of the period $t_3-t_0$ shown in FIG. 3.

In order to measure the duration of the active period of the operational cycle, a determination must be made as to when the active period ends, i.e. when the discharging phase $\Phi_2$ has finished. To this end, the digital counter circuitry 1010 may generate a fourth count value $C_4$ indicative of the duration of the active period when it detects or is notified that the second switch 140 has been turned off at the end of the discharging phase $\Phi_2$, by outputting (e.g. to an internal register of the digital counter circuitry 1010, or to a register external to the digital counter circuitry 1010) the count value that has been reached at this point in time. As will be apparent from the foregoing discussion, when the boost converter circuitry is operating in DCM, the fourth count value $C_4$ is indicative of the period $t_2-t_0$ shown in FIG. 3.

Thus the scaling factor k can be calculated, e.g. by the digital counter circuitry 1010 or by some other processing circuitry, and can be used to generate a signal Iavg_thresh that is indicative of the DCM cycle average inductor current.

In operation of the boost converter circuitry 1200, the signal Ipk_thresh output by the second adder circuitry 820 is indicative of a target peak inductor current in the boost converter circuitry 1200. The control loop acts to maintain Ipk_thresh at a desired level, and as no inductor current flows in the zero-current phase $\Phi_3$ when the boost converter circuitry 1200 is operating in DCM, it follows that the signal at the output of the DAC circuitry 470 (i.e. the signal Iavg_Φ1thresh that is received at the first input of the second adder circuitry 820) must be indicative of the average inductor current in the active period of the operational cycle, since $V_{add}$ is indicative of the Iripple/2, which is half the difference between the peak current and the average current. The DAC circuitry 470 simply converts a digital input signal into an equivalent analog output signal, so the signal output by the digital control circuitry 460 must be a digital version of Iavg_$\Phi_1$thresh.

As Iavg_$\Phi_1$thresh=k·Iavg_thresh, dividing the signal output by the digital control circuitry 460 by k (in the divider circuitry 1210) yields an output signal Iavg_thresh, which is indicative of the DCM cycle average inductor current of the boost converter circuitry 1200 when it is operating in DCM. As will be appreciated, when the boost converter circuitry 1200 is operating in CCM, k=1 and so the Iavg_thresh signal is also indicative of the cycle average inductor current in CCM.

The Iavg_thresh signal output by the divider circuitry 1210 can be used by downstream circuitry (not shown), e.g. for reporting the cycle average inductor current of the boost converter circuitry 1200.

Figure 13:
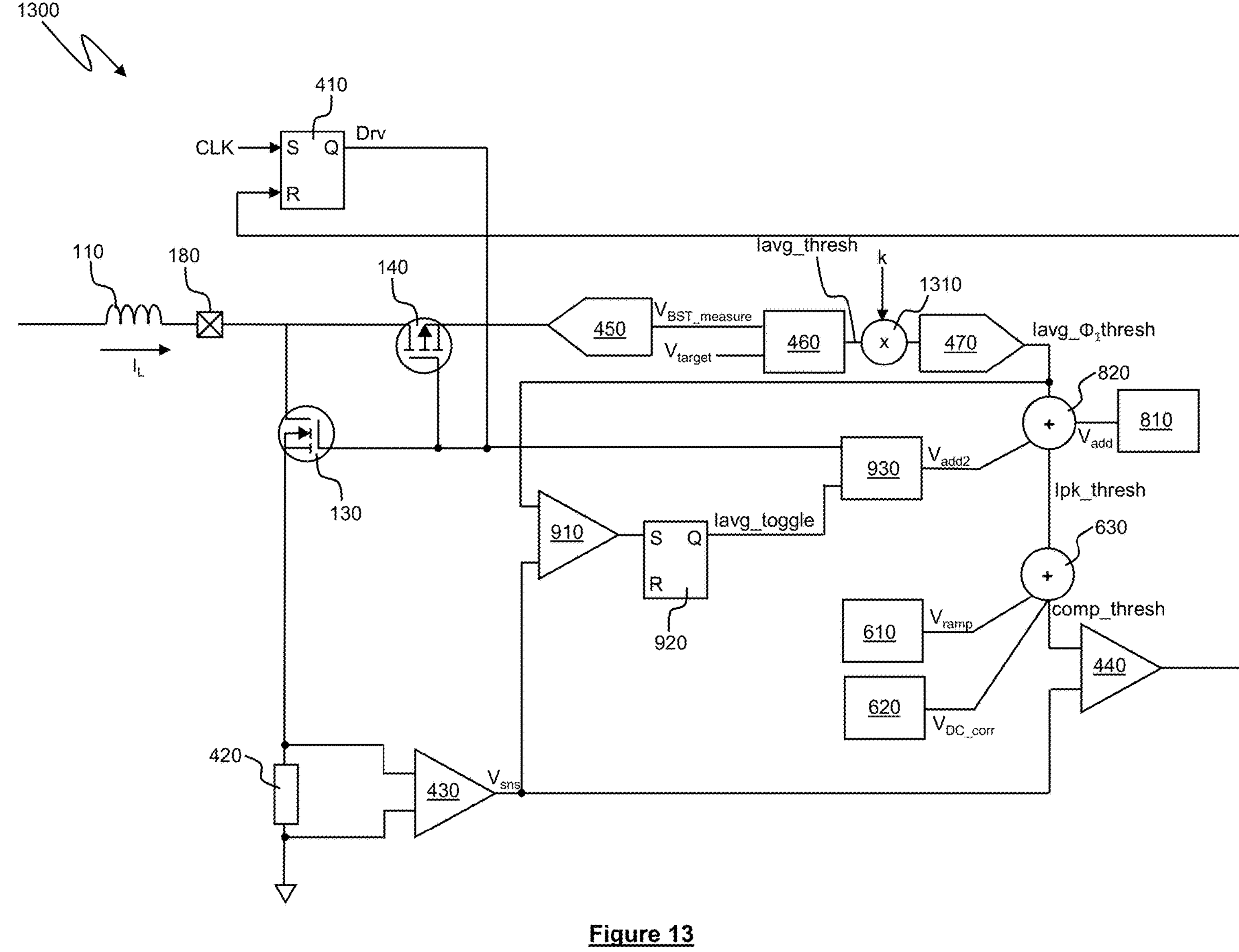
FIG. 13 is a schematic representation of boost converter circuitry including alternative circuitry configured to generate a signal indicative of a cycle average inductor current over a whole operating cycle when the boost converter circuitry is operating in DCM.

FIG. 13 is a schematic representation of alternative boost converter circuitry that includes circuitry for compensating for the effect of the zero-current phase $\Phi_3$ on the cycle average inductor current when the boost converter circuitry is operating in DCM, to generate a signal Iavg_thresh that is indicative of the DCM cycle average inductor current.

The boost converter circuitry, shown generally at 1300 in FIG. 13, includes a number of elements in common with the boost converter circuitry 900 of FIG. 9. Such common elements are denoted by common reference numerals in FIGS. 9 and 13, and will not be described again here.

The boost converter circuitry 1300 additionally includes digital multiplier circuitry 1310 coupled between the output of the digital control circuitry 460 and the input of the DAC circuitry 470 and configured to multiply the signal output by the digital control circuitry 460 by the scaling factor k.

As in the boost converter circuitry 1200, in operation of the boost converter circuitry 1300, the signal Ipk_thresh output by the second adder circuitry 820 is indicative of a target peak inductor current in the boost converter circuitry 1300. The control loop acts to maintain Ipk_thresh at a desired level, and as no inductor current flows in the zero-current phase $\Phi_3$ when the boost converter circuitry 1300 is operating in DCM, it follows that the signal at the output of the DAC circuitry 470 (i.e. the signal Iavg_Φ1thresh that is received at the first input of the second adder circuitry 820) must be indicative of the average inductor current in the active period of the operational cycle, since $V_{add}$ is indicative of the Iripple/2, which is half the difference between the peak current and the average current.

Thus the signal received at the input of the DAC circuitry 470 must be equal to k·Iavg_thresh (since the multiplier circuitry 1310 multiples a signal received at its input by the scaling factor k). The signal output by the digital control circuitry 460 is therefore Iavg_thresh, which is indicative of the DCM cycle average inductor current of the boost converter circuitry 1300. As will be appreciated, in operation of the boost converter circuitry 1300 when it is operating in CCM, k=1 and so the Iavg_thresh signal is also indicative of the cycle average inductor current in CCM.

Again, the Iavg_thresh signal can be used by downstream circuitry (not shown), e.g. for reporting the cycle average inductor current of the boost converter circuitry 1300.

Figure 14:
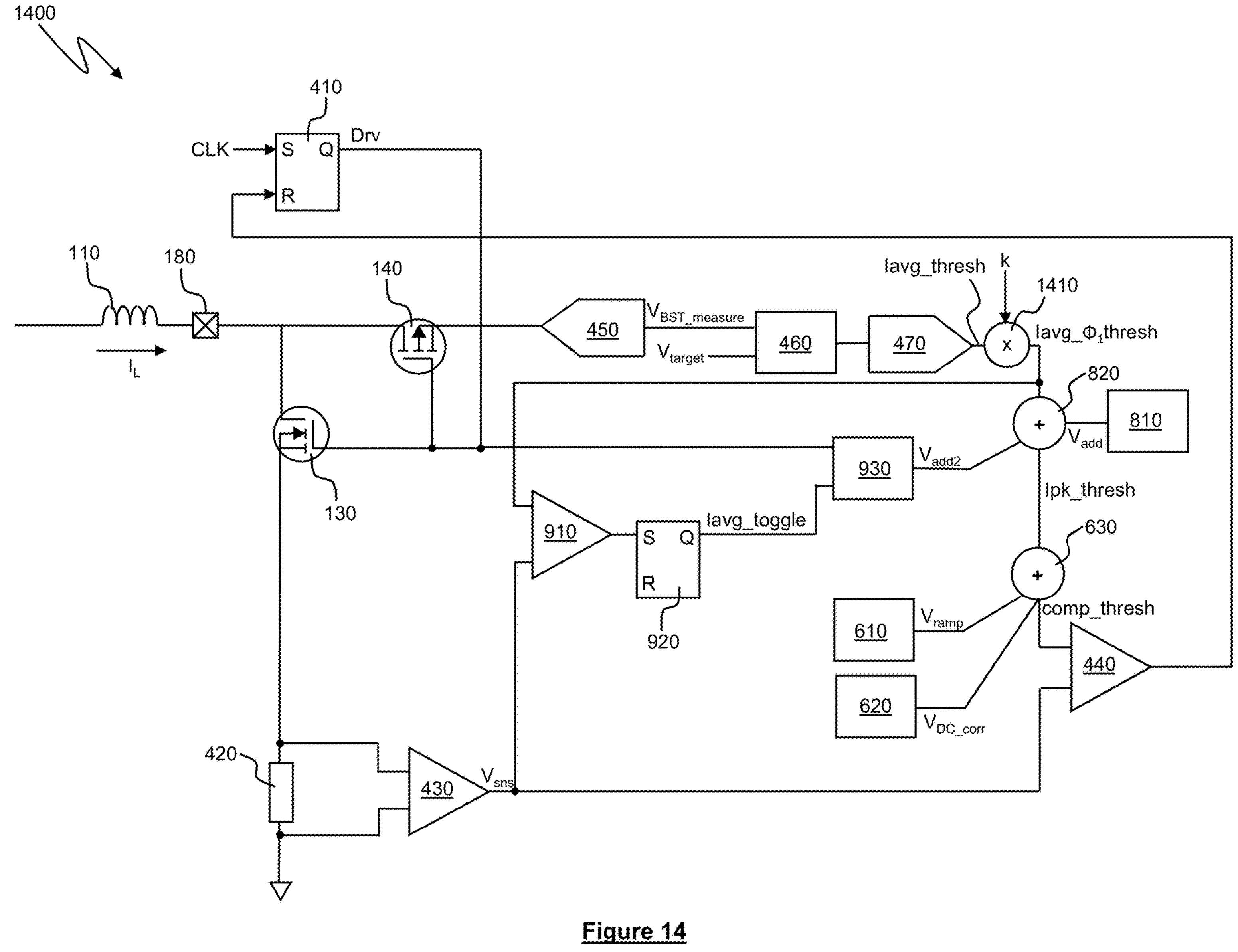
FIG. 14 is a schematic representation of boost converter circuitry including further alternative circuitry configured to generate a signal indicative of a cycle average inductor current over a whole operating cycle when the boost converter circuitry is operating in DCM.

FIG. 14 is a schematic representation of further alternative boost converter circuitry that includes circuitry for compensating for the effect of the zero-current phase $\Phi_3$ on the cycle average inductor current when the boost converter circuitry is operating in DCM, to generate a signal Iavg_thresh that is indicative of the DCM cycle average inductor current.

The boost converter circuitry, shown generally at 1400 in FIG. 14, includes a number of elements in common with the boost converter circuitry 900 of FIG. 9. Such common elements are denoted by common reference numerals in FIGS. 9 and 14, and will not be described again here.

The boost converter circuitry 1400 additionally includes analog multiplier circuitry 1410 coupled between the output of the DAC circuitry 470 and the input of the second adder circuitry 820, and configured to multiply the signal output by the DAC circuitry 470 by the scaling factor k, to generate a scaled analog output signal which is output to the second adder circuitry 820. This scaling of the DAC output signal causes the control loop to settle to a steady state in which the signal Iavg_thresh output by the DAC circuitry 470 is indicative of the average inductor current over the whole period of the operational cycle.

As in the example illustrated in FIG. 13, in operation of the boost converter circuitry 1400, the signal Ipk_thresh output by the second adder circuitry 820 is indicative of a target peak inductor current in the boost converter circuitry 1400. The control loop acts to maintain Ipk_thresh at a desired level, and as no inductor current flows in the zero-current phase $\Phi_3$ when the boost converter circuitry 1400 is operating in DCM, it follows that the signal at the output of the multiplier circuitry 1410 (i.e. the signal Iavg_Φ1thresh that is received at the first input of the second adder circuitry 820) must be indicative of the average inductor current in the active period of the operational cycle, since $V_{add}$ is indicative of the Iripple/2, which is half the difference between the peak current and the average current.

Thus the signal received at the input of the multiplier circuitry 1410 from the DAC circuitry 470 must be equal to Iavg_thresh, which is indicative of the cycle average inductor current over the whole of the operational cycle of the boost converter circuitry 1400 when it is operating in DCM. As will be appreciated, in operation of the boost converter circuitry 1400 when it is operating in CCM, k=1 and so the Iavg_thresh signal is also indicative of the cycle average inductor current in CCM.

The Iavg_thresh signal can be used by downstream circuitry (not shown), e.g. for reporting the cycle average inductor current of the boost converter circuitry 1400.

The principles of the present disclosure are described above with reference to boost converter circuitry, but it will be apparent to those of ordinary skill in the art that the principles of the present disclosure are equally applicable to other power converter circuitry, e.g. buck converter circuitry. Thus, the present disclosure is not limited to estimating current in boost converter circuitry, but also extends to estimating current in other power converter circuitry such as buck converter circuitry.

The circuitry described above with reference to the accompanying drawings may be incorporated in a host device such as a laptop, notebook, netbook or tablet computer, a gaming device such as a games console or a controller for a games console, a virtual reality (VR) or augmented reality (AR) device, a mobile telephone, a portable audio player or some other portable device, or may be incorporated in an accessory device for use with a laptop, notebook, netbook or tablet computer, a gaming device, a VR or AR device, a mobile telephone, a portable audio player or other portable device.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. Current detection circuitry for generating an average inductor current signal indicative of an average inductor current during an operational cycle of power converter circuitry, the current detection circuitry comprising:

circuitry for applying a ripple current estimate signal indicative of an estimate of half of a ripple current in the power converter circuitry to a peak inductor current signal, indicative of a peak inductor current during the operational cycle, wherein the ripple current is equal to a difference between the average inductor current and the peak inductor current, wherein the circuitry for applying the ripple current estimate signal comprises comparison circuitry for performing a comparison of a first period equal to half the duration of a charging phase of the power converter circuitry to a second period equal to a time taken for the inductor current in the power converter circuitry to reach the average current threshold, wherein the ripple current estimate signal is based, at least in part, on a result of the comparison.

2. Current detection circuitry according to claim 1, further comprising digital counter circuitry configured to generate a first count value indicative of the first period and a second count value indicative of the second period.

3. Current detection circuitry according to claim 2, wherein the comparison circuitry comprises digital comparison circuitry operative to compare the first count value to the second count value and to generate a comparator output signal based on the comparison.

4. Current detection circuitry according to claim 3, wherein the comparison circuitry further comprises digital accumulator circuitry configured to increase or decrease a ripple current estimate based on the comparator output signal.

5. Current detection circuitry according to claim 1, further comprising circuitry for generating the peak inductor current signal, wherein the circuitry for generating the peak inductor current signal comprises control circuitry configured to receive a first signal indicative of a target output voltage and a second signal indicative of an actual output voltage of the power converter circuitry and to generate the peak inductor current signal based on the first and second received signals.

6. Current detection circuitry according to claim 1, wherein the circuitry for applying the ripple current estimate signal is configured to generate and apply an additional DC voltage to the peak inductor current signal.

7. Current detection circuitry according to claim 6, wherein the comparison circuitry is configured to modify the additional DC voltage.

8. Current detection circuitry according to claim 1, further comprising current monitor circuitry configured to generate a signal indicative of an actual inductor current in the power converter circuitry during operation of the power converter circuitry.

9. Current detection circuitry according to claim 8, further comprising comparator circuitry configured to compare the signal indicative of the actual inductor current during operation of the power converter circuitry to a threshold that is based on the average inductor current signal.

10. Current detection circuitry according to claim 1, further comprising circuitry for generating a scaling factor k, wherein the scaling factor k is a ratio of the total period of an operational cycle of the boost converter circuitry to an active period of the operational cycle, wherein an active period is a period in which current flows through the inductor during the operational cycle.

11. Current detection circuitry according to claim 10, further comprising multiplier circuitry for applying the scaling factor k to a signal within a control loop of the current detection circuitry.

12. Current detection circuitry according to claim 10, further comprising divider circuitry outside of the control loop for applying the scaling factor k to a signal within a control loop of the current detection circuitry.

13. Current detection circuitry according to claim 1, wherein the ripple current estimate signal is based on a supply voltage to the power converter circuitry, an inductance of an inductor of the power converter circuitry and a charging period of the inductor.

14. Current detection circuitry according to claim 1, wherein the power converter circuitry comprises boost converter circuitry.

15. Power converter circuitry comprising current detection circuitry according to claim 1.

16. An integrated circuit comprising power converter circuitry according to claim 15.

17. A host device comprising current detection circuitry according to claim 1.

18. A host device according to claim 17, wherein the host device comprises a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console, a VR or AR device, a mobile telephone, a portable audio player or other portable device.

19. A host device comprising power converter circuitry according to claim 15.

20. A host device according to claim 19, wherein the host device comprises a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console, a VR or AR device, a mobile telephone, a portable audio player or other portable device.

* * * * *